United States Patent [19]
Werner et al.

[11] Patent Number: 5,377,122
[45] Date of Patent: Dec. 27, 1994

[54] LOGIC COMPILER FOR DESIGN OF CIRCUIT MODELS

[75] Inventors: Jeffrey A. Werner, San Jose; Daniel R. Watkins, Los Altos; Jimmy S. Wong, Cupertino; Yen C. Chang, Saratoga, all of Calif.

[73] Assignee: LSI Logic Corporation, Milpitas, Calif.

[21] Appl. No.: 147,419

[22] Filed: Nov. 1, 1993

Related U.S. Application Data

[63] Continuation of Ser. No. 403,247, Sep. 5, 1989, abandoned.

[51] Int. Cl.$^5$ ............................................. G06F 15/60
[52] U.S. Cl. ................................... 364/488; 364/578
[58] Field of Search .............. 364/488, 489, 490, 491, 364/578

[56] References Cited

U.S. PATENT DOCUMENTS

| | | | |
|---|---|---|---|
| 3,622,762 | 11/1971 | Dyer et al. | 364/489 |
| 4,263,651 | 4/1981 | Donath et al. | 364/491 |
| 4,590,581 | 5/1986 | Widdoes, Jr. | 364/578 |
| 4,635,218 | 1/1987 | Widdoes, Jr. | 364/578 |
| 4,758,953 | 7/1988 | Morita et al. | 364/490 |
| 4,813,013 | 3/1989 | Dunn | 364/900 |
| 4,831,524 | 5/1989 | Furgerson | 364/488 |
| 4,868,770 | 9/1989 | Smith et al. | 364/578 |
| 4,918,594 | 4/1990 | Onizuka | 364/200 |
| 4,922,432 | 5/1990 | Kobayaski et al. | 364/490 |
| 4,965,741 | 10/1990 | Winchell et al. | 364/488 |
| 4,970,664 | 11/1990 | Kaiser et al. | 364/488 |
| 5,034,899 | 7/1991 | Schult | 364/488 |
| 5,051,938 | 9/1991 | Hyduke | 364/578 |
| 5,111,413 | 5/1992 | Lazansky et al. | 364/578 |

FOREIGN PATENT DOCUMENTS

0416669A3 3/1991 European Pat. Off.

OTHER PUBLICATIONS

"Method Used in an Automatic Logic Design Generator (ALERT)" by T. D. Friedman et al., IEEE trans. on Computers, vol. C-18, No. 7, Jul. 1969, pp. 593–614.

"Quality of Designs from an Automatic Logic Generator (ALERT)" by T. D. Friedman et al., 7th DA Conference, 1970, pp. 71–89.

"A Front End Graphic interface to the First Silicon Compiler" by J. H. Nash et al., European Conf. on Electronic Design Automation (EDA84), 26–30 Mar. 1984, pp. 120–124.

"Badge-Building Block Adviser and Generator", by Andreas Munzner, et al., vol. 3 of 3, pp. 1887–1890, IEEE International Symposium on Circuits and Systems, May 8–11, 1989, Portland, Oregon.

"Full-Span Structural Compilation of DSP Hardware", by S. G. Smith, et al., International Conference on Acoustics, Speech, and Signal Processing, Apr. 6–9, 1987, Dallas, Texas.

"Automatic Generation of Behavioral Simulation Models Using Functional Abstraction", by K. Mark Alexander, et al. pp. 331–334, col. 1, line 18–line 35, Proceedings of the IEEE 1988 Custom Integrated Circuits Conference, May 16–19, 1988, Rochester, New York.

"Verification of VHDL Designs Using VAL" by Larry M. Augustin, et al. pp. 48–53, col. 2, 25th ACM/IEEE Design Automation Conference, Jun. 12–15, 1988.

"Display of Conditional Parameters Using Hierarchical Pop-Up Panels" p. 1065, vol. 29, No. 3, Aug. 1986, IBM Technical Disclosure Bulletin, New York.

*Primary Examiner*—Vincent N. Trans
*Attorney, Agent, or Firm*—Skjerven, Morrill, MacPherson, Franklin & Friel

[57] ABSTRACT

A logic compiler wherein verification of a generated circuit model is performed automatically by comparing the operation of the circuit model with that of a corresponding mathematical behavior model. A novel user interface and circuit model generation means enables the user to obtain, in real time, performance specifications on the circuit selected by the user as well as incurring other benefits.

7 Claims, 7 Drawing Sheets

Shift Registers

Q:   Return to Main Menu
H:   Help

1:   Shift Register

-> 1

Which technology do you want your function in? 0 - CMOS10K, 1 - LCB15
-> 0

Enter the name of the submodule
->    shifter

Enter number of bits
-> 4

Do you want Asynchronous Clear (AC)?   (y/n)
-> y

Do you want Asynchronous Set (AS)?   (y/n)
-> y

Do you want Asynchronous Load (ALD)?   (y/n)
-> n

Do you want Synchronous Clear (CRN)?   (y/n)
_> y

Do you want Synchronous Set (STN)?   (y/n)
_> n

Do you want Synchronous Load (SLD)?   (y/n)
_> n

Do you want Shift Enable (SEN)?   (y/n)
_> y

Do you want a Universal Shifter (SLR)?   (y/n)
_> y

Do you want a High Drive Shift Register? (y/n)
High Drive is not Supported in LCB15 at this time
_> n Enter choice of optimization? 1 -speed  0-gate
-> 1
Shift Register Generator You have selected (SLR), (SEN) and (CRN).

FIG. 3A

1) SEN > CRN > SLR
2) CRN > SEN > SLR

Enter you choice of priority
-> 1

You have selected (AC) and (AS)

1) AC>AS
2) AS>AC
3) AC=AS

Enter you choice of priority.
-> 1
Generating a 4 bit Shift Register...
SHIFTER NET generated.

Hit 'Return' to continue.

Key to FIG. 3

Functional Description: CARRY LOOK AHEAD ADDER

Specifications

1) Input Loading

A.i - approx. 11.1 U.L. plus wirelength
　　B.i - approx. 8.0 U.L. plus wirelength
　　CI - approx. 11.9 U.L. plus wirelength 2) Output Drive Capabilities

|    | #P    | #N   |
|----|-------|------|
| CO | -4.55 | 5.23 |
| S.i | -2.18 | 2.43 |

| BIT | CELL UNIT USED | AREA USED | Longest Rise del | Longest fall del | Shortest Rise del | Shortest fall del |
|-----|-----|------|---------|---------|--------|--------|
| 4   | 183  | 66   | 7.10 nS  | 6.80 nS  | 1.80 nS | 1.80 nS |
| 12  | 573  | 208  | 17.70 nS | 17.70 nS | 4.40 nS | 4.40 nS |
| 20  | 990  | 358  | 21.60 nS | 21.60 nS | 4.60 nS | 4.60 nS |
| 28  | 1401 | 509  | 22.40 nS | 22.40 nS | 4.70 nS | 4.70 nS |
| 36  | 1760 | 638  | 22.20 nS | 22.20 nS | 4.30 nS | 4.30 nS |
| 44  | 2150 | 780  | 26.70 nS | 26.70 nS | 4.30 nS | 4.30 nS |
| 52  | 2567 | 930  | 29.70 nS | 29.70 nS | 4.50 nS | 4.50 nS |
| 60  | 2978 | 1081 | 30.40 nS | 30.40 nS | 4.50 nS | 4.50 nS |

FIG. 6

PINSFILE 1
/* PINSFILE GENERATED BY PAN VERSION 9.200 ON 07/10/89 14:06:56 */

MODULE ADD8
/*

THIS FUNCTION IS GENERATED FROM FUNGEN VERSION 9.11.

THIS FUNCTION IS GENERATED IN CMOS10K TECHNOLOGY.

THIS FUNCTION GENERATOR WAS LAST UPDATED 7-23-88. (CGO11ARP)

THIS IS A RIPPER ADDER WITH THE FOLLOWING OPTIONS:
 MODULE NAME : AD8
 WIDTH : 8
*/
17 INPUTS
CI
A.7
A.6
A.5
A.4
A.3
A.2
A.1
A.0
B.7
B.6
B.5
B.4
B.3
B.2
B.1
B.0
9 OUTPUTS
CO
S.7
S.6
S.5
S.4
S.3
S.2
S.1
S.0

FIG. 7

LOGIC COMPILER FOR DESIGN OF CIRCUIT MODELS

This application is a continuation of application Ser. No. 07/403,247, filed Sep. 5, 1989 now abandoned.

FIELD OF THE INVENTION

This invention relates to logic compilers which are used in the computer aided design of logic circuits, and in particular, to an improved logic compiler which incorporates improved software verifying techniques, improved user interface techniques, and improved circuit model generation techniques.

BACKGROUND OF THE INVENTION

Logic compilers, also known as functional generators, are software tools used to create logic models, or circuit models. The model describes the mathematical or logical relationships between inputs into the model and outputs outputted from the model. The logic compiler may also design the actual circuit represented by the circuit model. The resulting circuit models may be then incorporated into a system model whose performance can then be verified. Ultimately, the system model may be used to develop the actual hardware corresponding to the system model.

Due to the complexity and extensive labor involved in developing logic compilers, only compilers for developing simple circuits or circuits which use a highly repetitive pattern, such as memory compliers for generating memory arrays, are available, where only a relatively limited variety of circuits and features are available to the user.

Further, prior art logic compilers generally require the user to have a relatively detailed knowledge of the logic compiler in order to properly instruct the logic compiler to generate a desired circuit model.

Still further, in prior art compilers there is no capability for the user to obtain performance data on the specific circuit selected, where the performance data represents the expected performance of the actual circuit in silicon.

What is needed in the industry is a more efficient means to develop and verify logic compilers so that the compiler can be developed and tested without requiring extensive software and labor resources. What is also needed is an improved user interface system which enables the user to use the logic compiler in the most efficient manner.

SUMMARY OF THE INVENTION

The invention is a logic compiler system which creates, in real time, a desired circuit model, selected by the user via a menu driven display, from one or more types of circuit building blocks.

The menu driven display provides a selection of options and features to the user through which the user instructs the logic compiler to develop the desired circuit model. Once all the desired options and features are selected, the logic compiler, in real time, generates the desired circuit model, which includes the circuit design itself. Thus, the user does not simply select one circuit model out of literally thousands of possible circuit models stored in a library. Instead, the logic compiler builds circuit models from one or more types of circuit building blocks, wherein algorithms in the logic compiler, generally associated with each feature selectable by the user, generate the required building blocks and connect the building blocks together to create the selected circuit model. Since each algorithm associated with a feature to be added to a circuit model may be used to modify many different circuit configurations, the compiler enables the generation of thousands of different types of circuit models without requiring a commensurate increase in software.

Verification of each of the perhaps thousands of different circuit models which may be developed using a single logic compiler is done automatically by the logic compiler. During verification of each of the circuit models to verify that the software creates accurate circuit models, the logic compiler, in real time, creates a circuit model for each of the possible circuit models one at a time and also generates a corresponding behavior model, which is simply a mathematical model of the actual circuit selected. Thus, along with each circuit model, a simple mathematical model representing the actual operation of the circuit is also created which provides the correct output of the circuit in response to an input. After a circuit model and corresponding behavior model is generated, a pattern of input signals is generated and automatically applied to both the behavior model and the circuit model. Hence, since the output of the behavior model is assumed to be correct due to its correspondence with the intended function of the circuit model, any difference between the output of the behavior model and the output of the circuit model identifies that the circuit model is faulty.

During the verification sequence, a flag associated with each faulty circuit model is set and the next permutation of circuit model and associated behavior model is then generated with an input pattern applied to their inputs. The results are again compared, and this process is repeated for each circuit model permutation.

After the verification sequence is completed, the software programmer reviews the flags identifying that the software related to that particular circuit model must be debugged.

In some cases more than one test pattern is required to verify all operation capabilities of each circuit model.

Therefore, instead of the verification process being the most labor intensive, the verification process using this inventive automated means is now one of the least labor intensive of all the tasks required to develop a logic compiler.

Further, in addition to the above-described means to develop a circuit model using gate level building blocks and means to verify each and every circuit model, a novel menu driven user interface is described. The user interface of this invention enables the user to efficiently develop a circuit model and enables the user to obtain the performance characteristics of each of the circuit models capable of being generated by the logic compiler. Generating the performance characteristics is accomplished by the logic compiler, in real time, by analyzing a particular circuit model chosen by the user and displaying the specific performance characteristics of the chosen circuit. The user may also verify the selected circuit model using the user's chosen input signals.

BRIEF DESCRIPTION OF THE DRAWINGS

FIG. 6 is a flowchart of the verification process used in the preferred embodiment.

FIG. 7 sows a PINS file indicating inputs and outputs of a selected circuit.

DETAILED DESCRIPTION

To understand the operation of the logic compiler and how the compiler creates circuit models in accordance with the user's instructions, the various menus displayed by the logic compiler to prompt the user to select an item from the menu will be discussed with reference to the accompanying figures. The logic compiler's operation in response to each selection by the user will then be discussed. Following discussion of the operation of the logic compiler, a novel method for verifying all possible circuit models capable of being created by the logic compiler will be explained. Additional features of the logic compiler enabled by the novel user interface and verification method will then be described.

Figure 1:
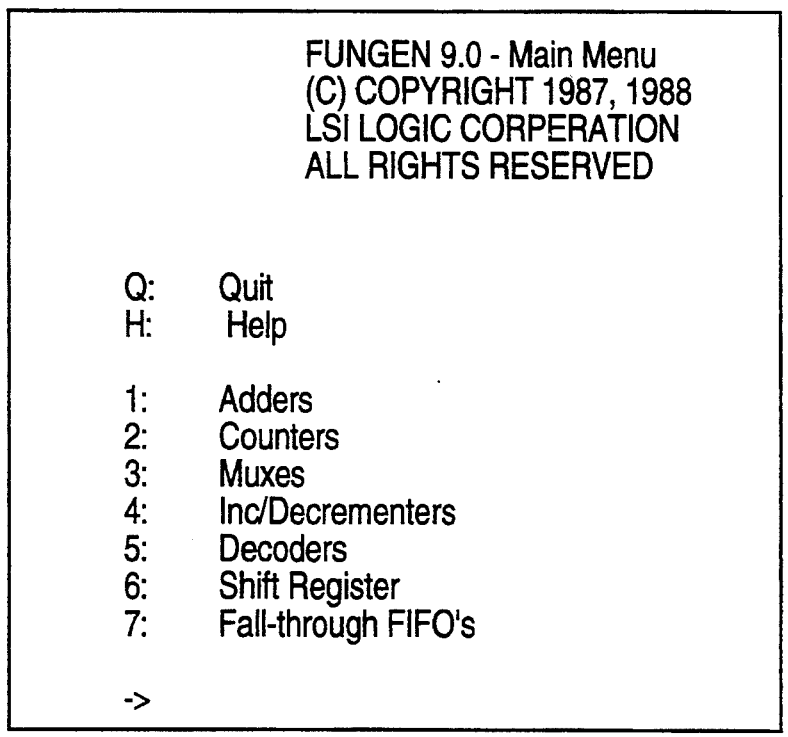
FIG. 1 shows the main menu displayed in the preferred embodiment of the invention.

FIG. 1 shows the main menu of the logic compiler displayed to a user. The logic compiler actually consists of a number of logic compilers, each dedicated to creating a certain general class of logic circuits. As seen in FIG. 1, the various classes of logic circuits which may be created with the preferred embodiment logic compiler described herein are adders, counters, multiplexers, incrementers/decrementers, decoders, shift registers, and fall-through FIFOs. The user then inputs into a keyboard a desired general class of logic circuits, resulting in the particular logic compiler dedicated to that class being accessed.

Figure 2:
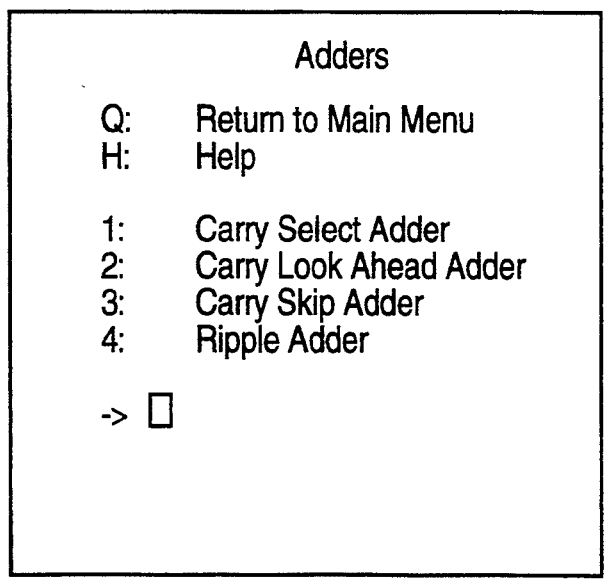
FIG. 2 shows a menu displayed after a selection is made by the user.

Assuming the user has selected the general class of adders, the menu shown in FIG. 2 is displayed giving the various types of adders which may be created by the logic compiler. In the preferred embodiment, the types of adders which may be chosen are carry select adder, carry look-ahead adder, carry skip adder, and ripple adder. These general types of adders are well known in the art.

Assuming the user has selected the carry look-ahead adder, the user is then prompted to identify the hardware technology in which to build the adder. In the preferred embodiment, the hardware technology is a selection of either CMOS10K or LCB15, where CMOS10K and LCB15 correspond to a particular silicon implementation of the circuitry which will form the adder.

The user is then prompted to provide an identifying name to the circuit model being created.

Next, the user is prompted to input the desired bit width of the adder. For purposes of illustration, assume the user has selected a four bit adder circuit with look-ahead carry. The logic compiler will then generate the selected circuit.

A novel feature of the logic compiler of this invention is that the logic compiler generates the various selected circuit models in real time without simply choosing the final selected circuit from a library containing all possible permutations of circuit models. Thus, with respect to the selected four bit adder circuit with look-ahead carry, an algorithm within the logic compiler is called upon to generate the various connections and circuit building blocks required for a four bit adder circuit with look-ahead carry. Although a larger bit width of the selected adder circuit increases the number of logic gates needed for the adder circuit, the connections between these building blocks of the adder circuit are systematic so that a single algorithm can generate adder circuits having a wide range of bit widths.

This algorithm may be readily developed by one of ordinary skill in the art given the established and well-known logic design techniques for determining the systematic connections between the building blocks comprising the adder circuit to create an adder circuit of any bit width having look-ahead carry. This type of software approach is used in the preferred embodiment logic compiler to generate all the adder circuit models available to the user. Thus, in the specific example of an adder, wherein any one of four separate types of adders may be chosen, as shown in FIG. 2, and wherein bit widths of between 1–64 bits may be selected, a total of 256 different adders are enabled by the adder logic compiler using algorithms which systematically generate all the permutations of possible adders without the use of a library. Consequently, the compiler requires much less memory than a compiler which, to create 256 adder circuit models, must store all 256 different adders in a library.

Figures 3, 3A, 3B:
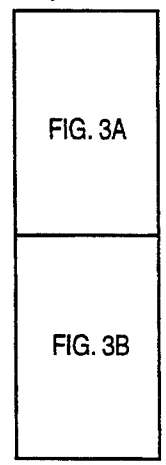
FIG. 3 shows a menu of the various features which can be added to a shift register.

The benefits of this novel method of generating the various permutations of all circuit models within a certain class of logic devices are better appreciated by examining the class of logic devices comprising shift registers. The particular logic compiler described herein offers the user a choice of shift registers with a bit width of between two bits to 128 bits and having the various options shown in the sample menu of FIG. 3. By selecting any of the various options, such as asynchronous clear, the logic compiler software incorporates this selected feature into the shift register. In the logic compiler described herein, the various permutations of bit capability and features result in a total of 825,000 different types of shift registers which may be generated by the logic compiler.

Figure 4:
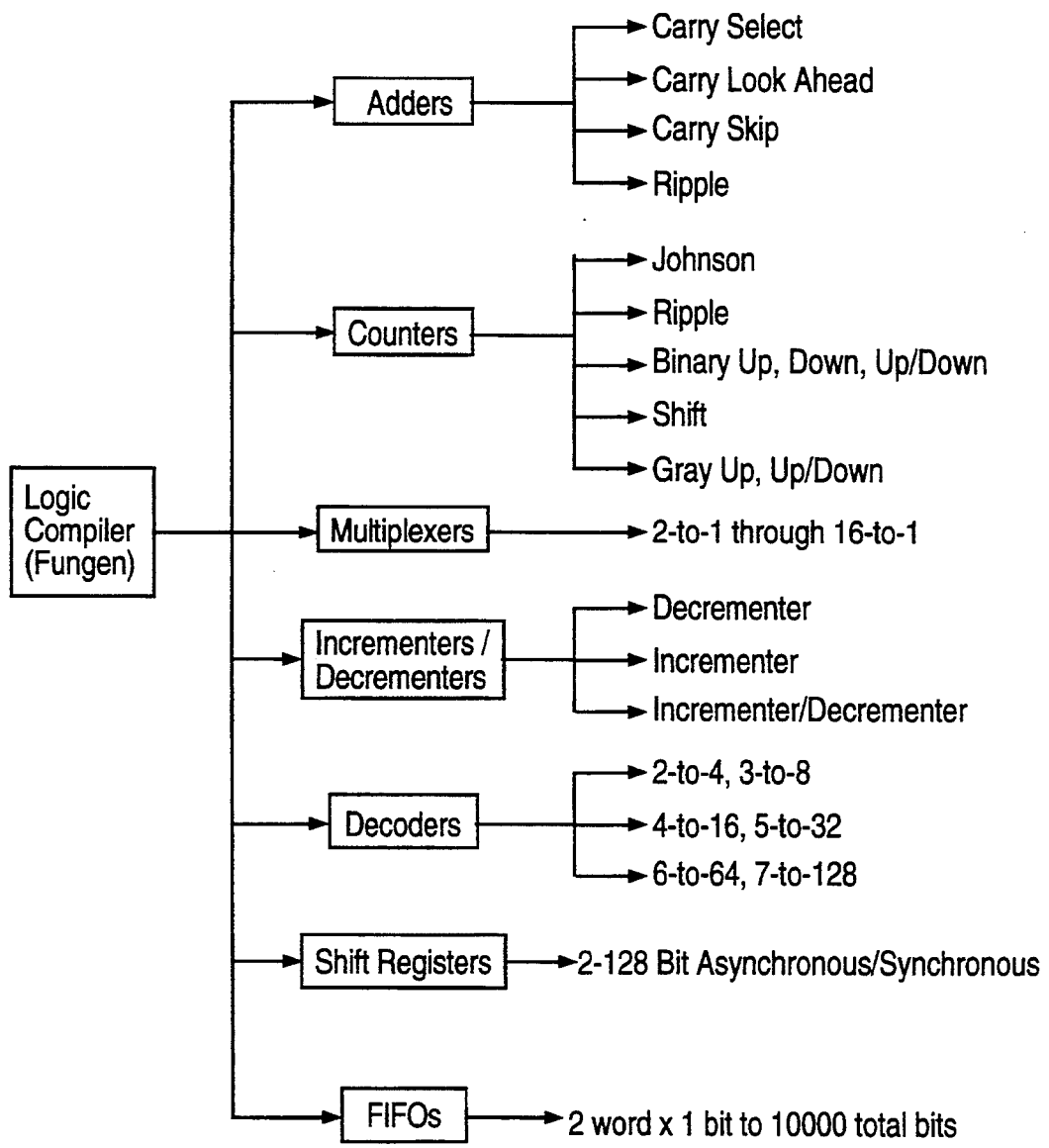
FIG. 4 shows generally the various features and bit widths available for certain classes of logic circuits in the preferred embodiment.

One of ordinary skill in the art can determine which general classes of logic devices would be desirable for a user and which circuit features to offer a user once the general class is selected. FIG. 4 shows certain general classes of logic devices and certain features available to a user. It will be apparent to one of ordinary skill in the art of software programming how to incorporate each of the offered features into a selected logic circuit having a selected bit width so that, generally, each feature may be considered as a signal subroutine in the logic compiler software program which is accessed each time that particular feature is selected. Developing the software for the logic compiler using independent subroutines enables the logic compiler to be debugged more quickly and in a more efficient manner.

The logic compiler is menu based so as to provide the user with clear options in the most efficient order as determined by the software programmer. To additionally assist the user, for each menu, the user may request help by pressing a key of the keyboard which causes a help subroutine associated with the menu to be displayed on the screen. Further, the various menus and queries put to the user are dependent upon the user's previous input so that only relevant menus and options are displayed.

In the preferred embodiment, the software used is platform independent, which means the logic compiler can be used on a variety of computer systems (a digital process 11 is shown in FIG. 6). This is accomplished by using an interpreter which translates and executes each line of the computer program before the next line of the computer program is considered. Although an interpreted program is slow, as much as 20 times slower than an assembled program, the interpreted program speeds up program development because the effect of the source code changes can be seen immediately.

In the herein described logic compiler, the representation of a selected circuit is in the form of a NET file. A NET file indicates all the interconnections between the building blocks used in a particular circuit model and, as such, represents the actual circuit design. As an example a NET file may represent a simple eight bit ripple adder, wherein each of the various building blocks in the NET file would be a full adder. Each full adder would have three inputs; one input being a carry bit, represented by three variables. Each full adder would also have two outputs (a sum bit and a carry bit), represented by two variables. An output of one full adder is applied to the input of another full adder where the same variable is shown in the NET file as being both an input and an output variable. Thus, by viewing the NET file, all the interconnections between the full adders may be known. The NET file is eventually used to implement the particular circuit into hardware.

In the preferred embodiment, a variety of types of building blocks may be used by the logic complier in the creation of a selected circuit. Various building blocks which may be used include: transistor or component level; logic gate level; functional level (e.g., full adders, incrementers); or Register Translation Language, wherein a building block is represented by its operation (e.g., "input+1") and a circuit corresponding to that operation is utilized. Thus, the circuit models may be created using one or more types of building blocks, as chosen by the programmer as being the most expedient means of creating a particular circuit model.

In developing the various logic compilers for each of the general classes of logic circuits, each possible type of logic circuit model which may be created by the logic compiler must be verified by the programmer to determine if the circuit models accurately model the circuit selected by a user. Heretofore, to verify the accuracy of each circuit model, a programmer had to apply a test pattern input to the input of each possible circuit model and compare the output to an expected value manually. Thus, heretofore, the verification portion of the development of the logic compiler was the most labor intensive portion in the development of the compiler. In the logic compiler described herein, verification of each circuit model is verified automatically in a continuous verification process.

Figure 5:
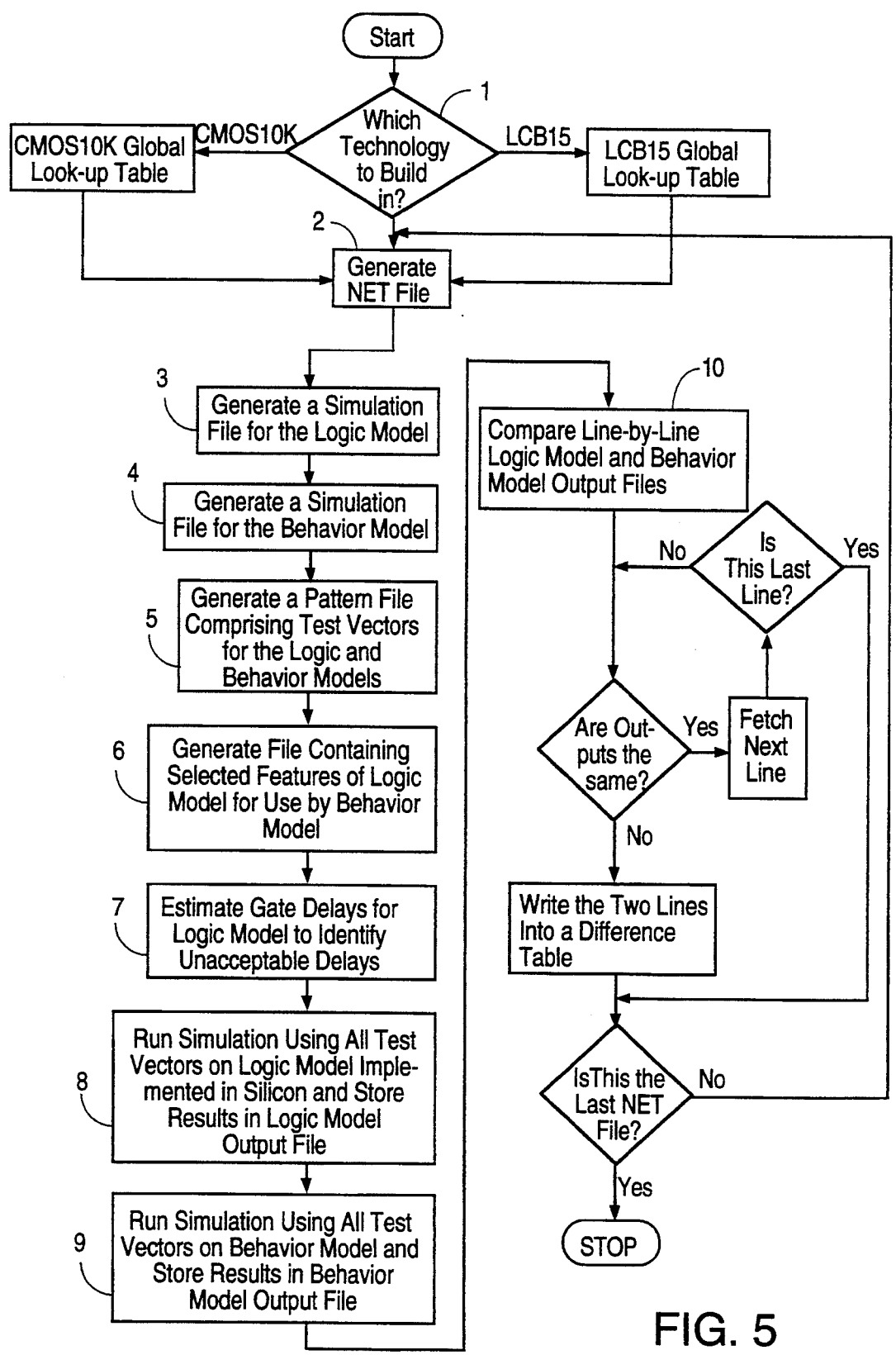
FIG. 5 is a flowchart of the verification process used in the preferred embodiment.

After the software programmer has completed the algorithms necessary for the generation of all circuit models to be generated by the compiler, the programmer implements the verification program represented by the flowchart of FIG. 5, which verifies the accuracy of each circuit model which may be created by the logic compiler.

In step 1 of the verification process of FIG. 5, the logic compiler automatically selects a technology (CMOS10K or LCB15) in which to build the circuits in silicon. Of course, this step can also apply to circuits formed in other semiconductor materials, such as gallium arsenide.

Upon the compiler's selection of either CMOS10K technology or LCB15 technology, the logic compiler then uses a global look-up table to enable the NET file generator to create circuit models (using a circuit model generation program 12 shown in FIG. 6) having characteristics of the actual corresponding circuit implemented in the particular technology selected.

After the particular technology is selected the verification program generates in step 2 a first NET file associated with a first circuit model.

Next, in step 3 a simulation file is generated for the particular circuit model associated with the NET file. The simulation file formats the circuit model to accept the various inputs to be applied to the circuit model and to provide the output signals from the model for storage after the simulation is run.

Next, in step 4 a simulation file is generated for a behavior model (created using a behavior model generation program 13 shown in FIG. 6) corresponding to the previously generated circuit model, wherein the behavior model is a simple mathematical model representing the actual operation of the circuit in response to an input. Generally, a behavior model software program is one fifth to one thirtieth the length of the circuit model program, since a behavior model can be simply described by equations without consideration of any interconnections.

Next, in step 5 a test pattern file is created which consists of the various test input signals, or test vectors, to be applied to both the circuit model and the behavior model to test all the various logic gates, interconnections, and features of the circuit model. The test pattern file is generated by algorithms (shown as pattern file generation program 14 in FIG. 6) which are dependent upon the type of circuit to be verified and may be written by a software programmer of ordinary skill in the art using well-known techniques. In some cases, to test all logic gates, interconnections, and features of the circuit model, a pattern file containing over 1,000 test vectors must be created, wherein each test vector represents a single set of parallel or serial inputs into the circuit model and behavior model, and wherein each test vector is sequentially applied to the inputs of the circuit model and behavior model.

Next, in step 6 a file is generated containing the features of the circuit model generated. This file will be used by the behavior model so that, in effect, the behavior model will possess those features of the circuit model. For example, for a shift register, a feature may be asynchronous clear, which would be performed by the behavior model.

Next, in step 7 gate delays for each of the gates comprising the circuit model are analyzed by looking at the loading on each gate to determine if the delay is acceptable. If a gate delay is unacceptable, a flag is set to identify the problem.

Next, in step 8 a simulation program 15, shown in FIG. 6, is run on the model of the actual circuit implemented in silicon by applying all test vectors previously generated to the inputs of the circuit model. The outputs of the circuit model resulting from the application of each test, vector to the inputs of the circuit model are then stored in a circuit model output file 16, shown in FIG. 6.

Next, in step 9 the simulation program 15 is run on the behavior model and the outputs stored in a behavior model output file 17, shown in FIG. 6.

Next, in step 10 the outputs of the logic model output file and the behavior model output file are compared (using a comparison program 18 shown in FIG. 6) line by line to determine any differences between the outputs of the behavior model and the outputs of the circuit model. If the comparison of the output files indicates an output of the circuit model is different than the corresponding output of the behavior model, these lines of the output files are written into a difference table.

The next line of the output files is compared until a last line of the output files is detected. When this last line is detected, a next NET file is then generated and the verification process is repeated. Once all the possible circuit models generated by the compiler have been tested and the outputs compared, the programmer then reviews the difference table to determine the accuracy of the software program. The programmer then debugs the portion of software which caused the discrepancy.

Since the circuit model programs are written in a modular fashion, where a subroutine is dedicated to a certain additional feature, the debugging and testing of the software is easily done by isolating the subroutine that implements that feature associated with the non-matching outputs. Thus, the compiler may be debugged in less time than in compilers not using the above-described verification process.

As seen, verification of the software is done directly and continuously by a computer without any human intervention. Consequently, the verification portion of the logic compiler development has now been reduced to being one of the least labor intensive tasks instead of the most labor intensive task.

Previously, behavior models were not generated in logic compiler programs and, thus, this automated verification process was clearly not performed.

The ability of a logic compiler to develop a behavior model associated with each circuit model available within the compiler enables a number of various highly commercial features of the compiler. For example, the user may be ensured that the user's selected circuit model is error free by directing the logic compiler to display the output of the behavior model and the circuit model in response to various inputs selected by the user. Alternatively, the test inputs may be generated using the test pattern generator. The user, in effect, implements the verification process of FIG. 5 for one selected NET file only. Hence, a valuable feature provided by the incorporation of a behavior model generator in the logic compiler is that it gives the user access to a customized verification process and allows the user to obtain precise performance specifications on a variety of custom input patterns on any circuit created by the logic compiler. Further, the menu driven display leads the user through the process required for the verification process and prompts the user as to the desired selection of the input signals. Heretofore, a user could not perform verification in real time since there would be no verification program in the compiler which generates a behavior model.

The user may also request documentation, generated in real time, on the specific circuit model the user has selected simply by responding to a prompt displayed by the menu. The logic compiler estimates the various accumulated delays within the selected circuit and generates performance data, in real time, on that particular circuit.

Schematic diagrams of the selected circuit model may also be selected by the user and printed out.

Documentation for the most popular types of circuits which can be created by the compiler is fixed in memory in the compiler. For example, the documentation for an adder with a carry look-ahead feature having various popular bit widths may be displayed as shown in FIG. 6. The various parameters displayed in the documentation are inputted by the software programmer based on known delays and known hardware constraints for each of the general types of circuits created by the logic compiler.

Once the user is satisfied with the chosen circuit model, the user may then incorporate the circuit model into a larger system model containing additional circuit models.

In the preferred embodiment, a PINS file, shown in FIG. 7, is created along with the NET file for a particular circuit. The PINS file contains a listing of the input and output terminals of the circuit represented by the NET file and is basically used to readily indicate the various parts of the circuit. The PINS file also contains the identification name of the NET file given by the user, the bit width of the modeled device, and the technology in which the circuit is to be implemented in silicon.

The above-described logic compiler may also find applicability for creating analog circuit models. All software within the logic compiler described above may be written by a software programmer of ordinary skill in the art, given the above description of the logic compiler. Of course, numerous differences in computer programs will result due to the differing techniques and skill levels of software programmers. As mentioned previously, in the preferred embodiment, the compiler software uses an interpreter to interact with a computer so as to enable the compiler to be used on a variety of computer systems to accommodate the widest number of users.

Thus, a logic compiler using a novel circuit model generation means, verification method, and user interface has been described herein. It will be obvious to those skilled in the art to make changes to the various embodiments described herein for various purposes while still keeping within the scope of the invention.

What is claimed is:

1. In an electronic apparatus which generates a circuit model representative of a circuit selectable by a user, an improvement comprising:
    a display;
    means for controlling said display to present a series of displays in menu format, wherein a circuit model representative of a circuit selectable by a user is generated in response to input requests from said series of displays;
    behavior model generation means for generating a mathematical behavior model corresponding to said circuit selectable by said user;
    pattern file generating means for generating a test pattern for input into a generated circuit model and a corresponding mathematical behavior model generated by said behavior model generation means;
    simulation means for operating said generated circuit model and said corresponding mathematical behavior model upon said test pattern and storing outputs from said generated circuit model and said corresponding mathematical behavior model; and comparison means for comparing said outputs from said generated circuit model and said corresponding mathematical behavior model and identifying corresponding outputs which do not represent a same output.

2. The apparatus of claim 1 wherein said display is for presenting a series of displays in menu format where a next display is dependent upon an input by said user in response to an input request displayed in a current display.

3. In an electronic apparatus which generates a circuit model representative of a circuit selectable by a user, an improvement comprising:

a digital processor; and display means coupled to said processor for presenting a series of displays in menu format, wherein a circuit model representative of a circuit selectable by a user is generated in response to input request from said series of displays, said processor comprising:

behavior model generation means for generating electrical signals representing a mathematical behavior model corresponding to said circuit selectable by said user;

pattern file generating means for generating a test pattern for input into a circuit model and a corresponding behavior model;

simulation means for operating said circuit model and said behavior model upon a generated pattern file and storing outputs from said circuit model and said behavior model; and comparison means for comparing said outputs from said circuit model and said behavior model and identifying corresponding outputs which do not represent a same output.

4. The apparatus of claim 3 wherein said display means presents said series of displays where a next display is dependent upon an input by said user in response to an input request from a current display.

5. A method of verifying a logic compiling system using a digital processor comprising the steps of:

generating a circuit model capable of being created by said logic compiling system, said circuit model identifying logical relationships between input signals into said circuit model and output signals from said circuit model;

generating a behavior model corresponding to said circuit model, said behavior model being a mathematical model of the actual circuit intended to be modelled by said circuit model;

generating a pattern file consisting of one or more test vectors for application to said circuit model and said behavior model;

applying each of said test vectors to said circuit model and said behavior model and obtaining output signals from said circuit model and said behavior model associated with each of said test vectors;

comparing output signals from said circuit model with output signals from said behavior model and identifying output signals from said circuit model and corresponding behavior model which do not represent a same output; and repeating the above steps for other circuit model capable of being generated by said logic compiling system for which verification is desired, said above steps being carried out by said digital processor.

6. The method of claim 5 further comprising the step of determining loading of logic gates constituting said circuit model to identify gate delays which are longer than a predetermined criteria.

7. The method of claim 5 further comprising the step of correcting said logic compiling system if, in said step of comparing, said output signals from said circuit model and corresponding behavior model do not represent a same output.

* * * * *